(12) United States Patent
Hakenberg

(10) Patent No.: US 11,824,484 B2
(45) Date of Patent: Nov. 21, 2023

(54) SOLAR ENERGY ROOF TILE, SOLAR ENERGY SYSTEM AND METHOD FOR OBTAINING ENERGY FROM SOLAR RADIATION

(71) Applicant: MEYER BURGER (GERMANY) GMBH, Hohenstein-Ernstthal (DE)

(72) Inventor: Peter Hakenberg, Solingen (DE)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 60 days.

(21) Appl. No.: 17/609,929

(22) PCT Filed: May 15, 2020

(86) PCT No.: PCT/EP2020/063711
§ 371 (c)(1),
(2) Date: Nov. 9, 2021

(87) PCT Pub. No.: WO2020/229686
PCT Pub. Date: Nov. 19, 2020

(65) Prior Publication Data
US 2022/0209708 A1    Jun. 30, 2022

(30) Foreign Application Priority Data
May 15, 2019   (DE) ...................... 10 2019 112 799.8

(51) Int. Cl.
*H02S 20/24* (2014.01)
*H02S 40/42* (2014.01)
(Continued)

(52) U.S. Cl.
CPC ................ *H02S 20/24* (2014.12); *E04D 1/18* (2013.01); *E04D 1/2916* (2019.08);
(Continued)

(58) Field of Classification Search
CPC ........ H01L 31/00–078; H02S 10/00–40; H02S 20/00–32; H02S 30/00–20
See application file for complete search history.

(56) References Cited

U.S. PATENT DOCUMENTS 5,480,494 A    1/1996 Inoue
6,294,724 B1 *  9/2001 Sasaoka ................. H02S 20/25
                                                            438/66
(Continued)

FOREIGN PATENT DOCUMENTS

DE           2529095 A1    1/1977
DE      102011055904 A1    6/2013
(Continued)

OTHER PUBLICATIONS

International Search Report dated Nov. 13, 2020 re: Application No. PCT/EP2020/063711, pp. 1-3, citing: WO 2008137966 A2, DE 2529095 A1 and DE 102016107016 A1.

*Primary Examiner* — Bach T Dinh
(74) *Attorney, Agent, or Firm* — CANTOR COLBURN LLP

(57) ABSTRACT

A solar energy roof tile, thermally and/or electrically conductively connected to an adjacent solar energy roof tile, includes a lower face for placing on at least some regions of a roof construction, an upper face opposite the lower face formed at least in some regions by a solar energy utilisation module, two opposite lateral walls, a rear face connecting the lateral walls, and a front face opposite the rear face that connects the lateral walls. The two lateral walls, the rear face and front face together connect the lower and upper faces, such that a cavity is formed between the two lateral walls, the rear face, front face, and lower and upper faces. The lower face has, in the region of the front face, a lower opening for providing access. The upper face has, in the (Continued)

region of the rear face, an upper opening for providing access into the cavity.

14 Claims, 7 Drawing Sheets

(51) Int. Cl.
| | | |
|---|---|---|
| *H02S 40/44* | (2014.01) | |
| *F24S 80/30* | (2018.01) | |
| *F24S 10/50* | (2018.01) | |
| *F24S 20/69* | (2018.01) | |
| *E04D 1/00* | (2006.01) | |
| *E04D 1/18* | (2006.01) | |
| *E04D 1/30* | (2006.01) | |
| *F24S 20/00* | (2018.01) | |
| *E04D 1/34* | (2006.01) | |
| *F25B 27/00* | (2006.01) | |

(52) U.S. Cl.
CPC ......... *E04D 1/2918* (2019.08); *E04D 1/2935* (2019.08); *E04D 1/30* (2013.01); *F24S 10/50* (2018.05); *F24S 20/69* (2018.05); *F24S 80/30* (2018.05); *H02S 40/425* (2014.12); *H02S 40/44* (2014.12); *E04D 1/34* (2013.01); *E04D 2001/308* (2013.01); *E04D 2001/3423* (2013.01); *E04D 2001/3467* (2013.01); *E04D 2001/3494* (2013.01); *F24S 2020/13* (2018.05); *F25B 27/002* (2013.01)

(56) References Cited

U.S. PATENT DOCUMENTS

| | | |
|---|---|---|
| 2001/0050101 A1 | 12/2001 | Makita et al. |
| 2008/0302030 A1* | 12/2008 | Stancel ............... H01L 31/0521 |
| | | 136/246 |
| 2011/0041428 A1* | 2/2011 | Posnansky ............. F24S 80/58 |
| | | 52/173.3 |
| 2014/0158648 A1 | 6/2014 | Brodam |
| 2018/0224159 A1 | 8/2018 | West et al. |

FOREIGN PATENT DOCUMENTS

| | | |
|---|---|---|
| DE | 202013602407 U1 | 8/2013 |
| DE | 102016104096 A1 | 9/2017 |
| DE | 102016107016 A1 | 10/2017 |
| EP | 0018543 A1 | 11/1980 |
| FR | 2931855 A1 | 12/2009 |
| WO | 0077860 A2 | 12/2000 |
| WO | 02101839 A1 | 12/2002 |
| WO | 2008137966 A2 | 11/2008 |

* cited by examiner

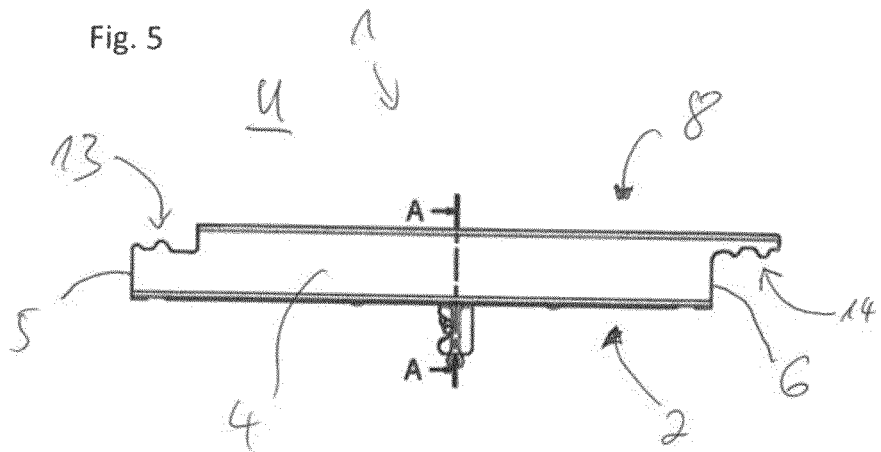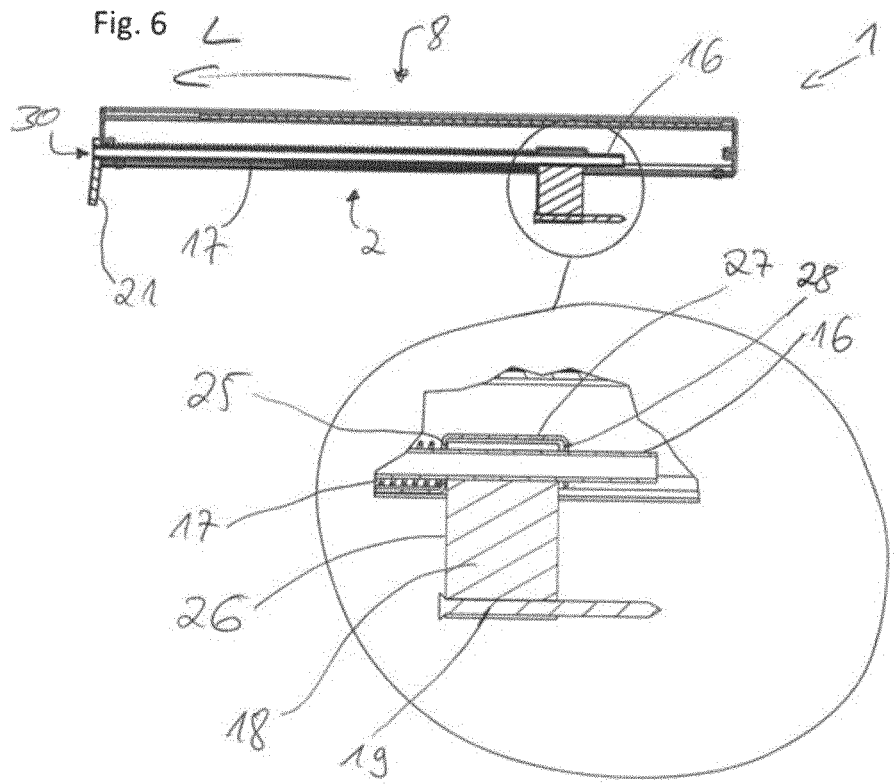

Fig. 12
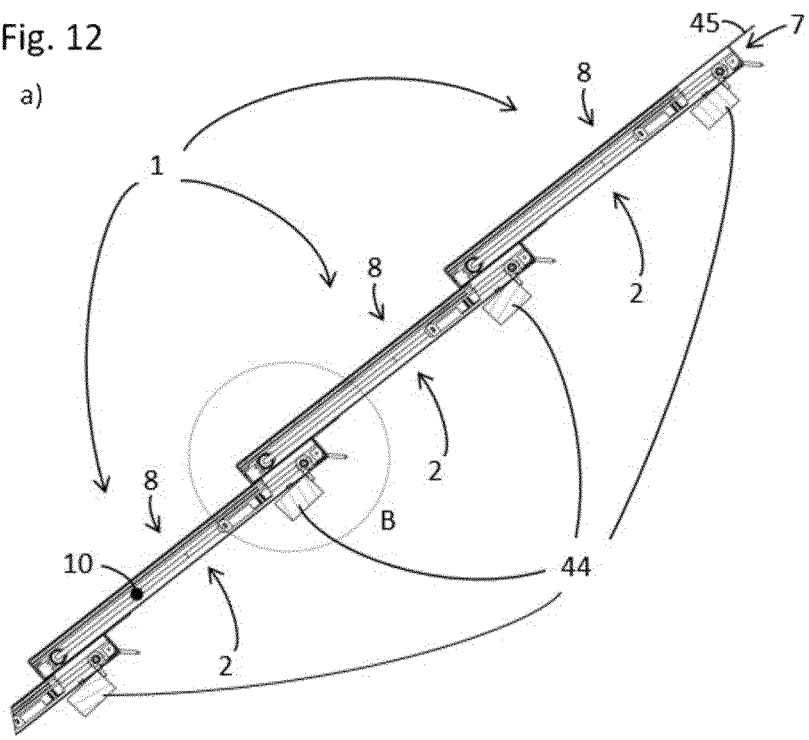
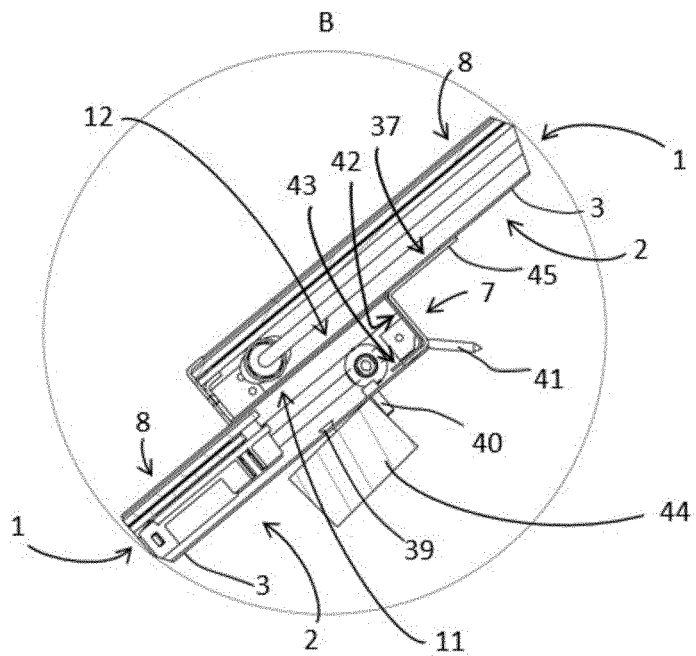

SOLAR ENERGY ROOF TILE, SOLAR ENERGY SYSTEM AND METHOD FOR OBTAINING ENERGY FROM SOLAR RADIATION

TECHNICAL FIELD

The disclosure relates to a solar energy roof tile, the shape of which substantially corresponds to the shape of a conventional roof tile. Furthermore, the present disclosure relates to a solar energy system, as well as a method for obtaining energy from solar radiation and simultaneously utilising the waste heat.

BACKGROUND

A solar energy roof tile can be understood to mean either a photovoltaic roof tile, a solar thermal energy roof tile, and also as a combined roof tile (also called a combination roof tile), which uses both technologies in the form of photovoltaics and solar thermal energy. A photovoltaic roof tile is configured to obtain electrical energy from solar energy and, for this purpose, comprises a photovoltaic module on its upper face which is normally turned toward the sun during proper operation. A solar thermal energy roof tile, on the other hand, is configured to obtain thermal energy from solar radiation and, for this purpose, comprises a solar thermal module on its upper face which is normally turned toward the sun during proper operation. In the context of this application the term solar energy utilisation module is used as a collective term for the two specific examples of photovoltaic module and solar thermal energy module. In the case of a solar energy roof tile, which is designed as a combined roof tile for using both technologies, such a solar energy utilisation module is provided on the upper face, which normally faces the sun during proper operation, and the module comprises both a photovoltaic module and a solar thermal energy module. Both electrical energy and thermal energy from the solar radiation are then extracted or used by means of the solar energy utilisation module.

Solar thermal energy, in particular the provision of hot water, is a widely used technique for utilising solar radiation. Solar panels are used for heating a fluid. The solar radiation strikes an absorber surface of the panel and heats it. The heat obtained is transferred to a permeating medium, usually a liquid or also air. The medium heated by the solar radiation is usually directed to a hot water storage tank by a circulating pump, the heat extracted being transferred via a heat exchanger from the heated medium (e.g. a carrier liquid) to the utility or drinking water in the hot water storage tank. The medium cools down in the process and is then fed back to the collector, i.e. the collector for the medium.

If a liquid is used as the medium, an antifreeze-water mixture is particularly suitable. Alternatively, heating water can itself be pumped into the panel and heated in it. In this case, drinking water can also be heated via the heat exchanger.

Solar thermal roof tiles and the use of roof surfaces for the installation of solar thermal roof tiles are known. Solar thermal roof tiles can be used instead of the commonly used roof tiles, slates or stones. Solar thermal roof tiles also contain an absorber to absorb the solar energy and are passed through a medium, preferably a fluid, which is heated accordingly. The installation of such solar roof tiles is expensive and relatively difficult compared to a conventional roof covering with commercially available roof tiles. A major problem is the high installation effort required to connect the individual solar thermal roof tiles. The permeating medium must be routed from one solar thermal roof tile to the next, and the connection must be suitably leak-proof. The installation effort and time required is therefore significantly higher, mainly due to producing the connections between the fluid lines. Within this application, producing such a connection between adjacent solar thermal roof tiles or, in general, the connection of fluid lines or fluid-conducting lines between adjacent solar energy roof tiles, is also referred to as the production of a thermally conductive connection between adjacent solar thermal roof tiles.

If adjacent solar energy roof tiles are mentioned in the context of the present application, this will normally mean the roof tiles adjacent in a vertical direction when installed on the roof, i.e. upwards toward the roof ridge or downwards toward the roof gutter, and not adjacent roof tiles to the left or right in a horizontal direction. Where reference is to be made to adjacent roof tiles in the horizontal direction (to the left or right), however, this will be pointed out.

A previously mentioned solar thermal energy roof tile and its installation are described in detail for example in DE 2011 055 904 A1 and DE 20 2013 002 407 U1. The installation of the roof tiles described therein is expensive and difficult, especially because additional components are required and changes to the support structure are necessary.

SUMMARY

The present disclosure is intended to remedy this situation. However, the present disclosure is described below in particular using the example of photovoltaic technology, specifically using the example of a photovoltaic roof tile. The advantages described later, however, can also be transferred to a solar thermal roof tile or a combined roof tile (combination roof tile), which uses both techniques in the form of solar thermal energy and photovoltaics.

Photovoltaics is also already a widely used technology for utilising solar radiation. The solar radiation is incident on a photovoltaic module with solar cells. These convert the energy of sunlight into electrically usable energy. The conversion of solar energy into electrically usable energy is well known and will not be explained further.

The use of roof surfaces for the installation of solar collectors is widespread. Commercially available solar collectors are usually additionally installed on already fabricated roofs. In this respect, they are also referred to as elevated solar panels. In this case, fastening elements often have to be mounted on the roof support structure through the roof cover, wherein the fastening must be storm-resistant and preferably also corrosion-resistant. When the conventional roof covering is penetrated, sealing and subsequent leak-proofing problems are inevitably caused. In addition, there is an increase in the roof load, which often leads to a necessary reinforcement in the roof frame. In addition, such solar panels have a negative impact on the visual appearance of the roof.

Alternatively, photovoltaic roof tiles are known that are used instead of the usually used roof tiles, slates or roofing stones. Photovoltaic roof tiles contain photovoltaic modules or solar cells on their upper face, i.e. facing the sun, for collecting and converting the solar energy. These largely avoid the above-mentioned disadvantages of the elevated solar panels, that is, those mounted on an existing covered roof, however, the installation of photovoltaic roof tiles is expensive and relatively difficult compared to a conventional roof covering with commercially available roof tiles.

A major problem is the high installation costs for the electrical connection of the individual photovoltaic roof tiles. The electric current must be routed from one photovoltaic roof tile to the next, which is why the installation and time required due to the connection work is significantly higher than with large-scale solar panels.

A photovoltaic roof tile of this kind and its installation are described in detail, for example, in DE 10 2011 055 904 A1 and DE 20 2013 002 407 B1. The installation of the roof tiles described therein is expensive and difficult, especially because additional components are required and changes to the support structure are necessary. Here, a photovoltaic roof tile already offers a remedy, as is disclosed in DE 10 2016 104 096 A1, for example, where the installation can also be further optimised there.

All of the above-mentioned solar energy roof tiles are also in need of optimisation with regard to the efficient use of energy. In the context of a demand for ever-improved energy usage by households, it is desirable to use the energy provided by solar radiation in the best possible way and in a simple way.

The present disclosure provides a solar energy roof tile, the production, installation and maintenance of which is as simple and inexpensive as possible. Furthermore, it is desirable that the energy yield is further optimised. The installation process should differ as little as possible from that of a roof covering with standard roof tiles.

This is achieved by providing a solar energy roof tile having the features of patent claim 1. This is also achieved by providing a solar energy system having the features of patent claim 11 and by a method having the features of patent claim 14.

Essential to the disclosure is the finding that two openings are provided, namely an upper opening in the upper face of the solar energy roof tile and a lower opening in the lower face of the solar energy roof tile, through both of which openings installation works can be easily carried out. The necessary connections, for example, of the solar energy roof tile to the roof battens underneath, but also of adjacent solar energy roof tiles to each other, can be created but also released again if necessary. It is particularly advantageous that such installation work can always be carried out from above, from the upper face of a solar energy roof tile. Thus, through the upper opening, access to a solar energy roof tile and thus also down to the lower face of the roof tile can take place from above. In the case of solar energy roof tiles arranged adjacent to each other in a vertical direction, for example in a solar energy system, access can then be ensured through the lower opening in the lower face, for example, to the next solar energy roof tile located further below, in particular again from above. Thus, the upper opening of a solar energy roof tile underneath and the lower opening of an adjacent solar energy roof tile above can be at least partially aligned. The upper opening then allows access from above to the cavity of the solar energy roof tile arranged above it. In addition, access can also be made into the cavity of the adjacent solar energy roof tile below through the aligned lower opening of this solar energy roof tile and further through the upper opening of the solar energy roof tile below it. In this way, the necessary electrical and also thermal conductive connections between adjacent solar energy roof tiles can be implemented in a solar energy system.

In detail, a solar energy roof tile is proposed, the shape of which substantially corresponds to the shape of a conventional roof tile and which can be thermally and/or electrically conductively connected to an adjacent solar energy roof tile. The solar energy roof tile comprises:

a lower face for placing on at least some regions of a roof structure, an upper face opposite the lower face, said upper face being formed at least in some regions by a solar energy utilisation module, two opposite lateral walls, a rear face connecting the two lateral walls, and a front face opposite the rear face that also connects the two lateral walls, The two lateral walls, the rear face and the front face together connect the lower face and the upper face, such that a cavity is formed between the two lateral walls, the rear face, the front face, the lower face, and the upper face. The lower face has, in the region of the front face, a lower opening for providing access and the upper face has, in the region of the rear face, an upper opening for providing access into the cavity from the surroundings.

According to one variant embodiment the solar energy roof tile can be designed as a photovoltaic roof tile for obtaining electrical energy from solar radiation and the solar energy utilisation module can be designed as a photovoltaic module. Alternatively, the solar energy roof tile can be designed as a solar thermal energy roof tile for obtaining thermal energy from solar radiation and the solar energy utilisation module can be designed as a solar thermal energy module. However, the solar energy roof tile can also be designed as a combined roof tile (combination roof tile) for obtaining electrical and thermal energy from solar radiation and the solar energy utilisation module can be designed as both a photovoltaic module and a solar thermal energy module. As described in the introduction, the solar thermal module is used to transfer the heat absorbed by the solar radiation to a fluid and thus to use the thermal energy.

When, in the context of this application, a solar energy roof tile is mentioned, this can also mean both a photovoltaic roof tile and a solar thermal roof tile as well as a combined roof tile. The advantages of the present disclosure are explained below, in particular using the example of the photovoltaic roof tile. However, these advantages are also normally transferable to the other two types of solar energy roof tiles mentioned above. In particular, the advantages relating to the production of electrical connections are also transferable to the production of thermal connections, in particular the connection between fluid lines or fluid-carrying lines, between adjacent solar thermal roof tiles.

According to one advantageous design of the solar energy roof tile, the lower opening is formed as an inlet opening for ambient air flowing into the cavity from the surroundings and the upper opening as an outlet opening for the ambient air from the cavity. As a result, the energy yield is optimized in a particular way. This is clear from the example of a photovoltaic roof tile. Thus, a space can be provided within the proposed photovoltaic roof tile, in which the waste heat, such as from the photovoltaic module being heated, can be used. The resulting heat can be easily transferred to the ambient air flowing through the photovoltaic roof tile, which can later be deployed and used in a targeted manner, for example within the household by means of a heat pump which can be operated by the heated air. For this purpose, the photovoltaic roof tile has an inlet opening for incoming ambient air and an outlet opening for the then heated ambient air. On its way through the interior of the photovoltaic roof tile, the ambient air flows past the photovoltaic module or components adjacent to the photovoltaic module, among other items, and absorbs the heat generated there. In an installed state on a roof structure with multiple adjacent (viewed vertically, above and below) photovoltaic roof tiles, the inlet opening is arranged below the outlet opening with respect to the essentially horizontal position. Air flows into the inlet opening arranged near to a front face of the photovoltaic roof tile, arranged at the bottom in the installed state, which air automatically rises within the photovoltaic roof tile during heating due to its rising temperature, and thus flows towards the outlet opening, which is arranged near the rear face of the photovoltaic roof tile arranged at the top in the installed state. There, the heated ambient air leaves the interior of the photovoltaic roof tile again and can flow, for example, into the next inlet opening of the adjacent photovoltaic roof tile, arranged above it, and can be further heated there.

The advantages described in terms of an optimised energy yield are particularly important in the case of photovoltaic roof tiles because there the energy resulting from solar radiation is otherwise only used in the form of electrical energy. However, due to the described use of the waste heat of the photovoltaic module the thermal energy is now also advantageously used. On the other hand, the photovoltaic modules are also cooled from below by the ambient air flowing around them, i.e. by the circulation on their inner side facing the cavity, and the resulting heat is dissipated so that the components are also advantageously protected from overheating. As the remainder of the application deals in particular with the example of a solar energy roof tile in the form of a photovoltaic roof tile, the terms inlet opening and outlet opening are primarily used for the lower opening and the upper opening respectively of the solar energy roof tile or photovoltaic roof tile. However, since the same access to the cavity can also be provided by the inlet opening as the lower opening, and the outlet opening as the upper opening can also provide access to the cavity, these terms for the openings can be understood as equivalent, in particular with regard to all the design advantages described, especially in the form of installation advantages. The design advantages described below due to the inlet opening and outlet opening are thus also transferable to other types of solar energy roof tile with the upper and lower openings provided according to the proposal.

The shape of the solar energy roof tile according to the disclosure essentially corresponds to the shape of a conventional roof tile, so that the external appearance of a roof or a house is barely changed by the use of the solar energy roof tile. The term "roof tile" here is to be understood as a synonym for roof covering elements such as roof tiles, roof slates or roof shingles and is not intended to restrict the disclosure to roof tiles.

The solar energy roof tile according to the disclosure has basically the same dimensions as a standard roof tile without a solar energy utilisation module or photovoltaic module.

For the electrical connection of a plurality of adjacent photovoltaic roof tiles, a photovoltaic roof tile normally has two electrical connecting elements. These are usually a first electrical connecting element in the form of a plug and a second electrical connecting element in the form of a socket. The plug of the one photovoltaic roof tile can then be inserted into the socket of the other, adjacent photovoltaic roof tile for the purpose of creating the electrical connection, whereby the electrical contacts are electrically conductively connected to each other.

The electrical connecting elements are in turn connected to the photovoltaic module. The photovoltaic module may be part of a so-called glass package. For example, a glass package may consist of two glass plates, between which one or more solar cells, preferably formed of silicon nitride, may be arranged. In turn, these solar cells can be embedded between two films, for example made of ethylene vinyl acetate (EVA). In the photovoltaic module or in the entire unit of the glass package, solar radiation is converted into electrical energy in a known manner. The electrical energy thus obtained can then be forwarded via the connected electrical connecting elements and then used in a targeted manner. Alternatively, the electrical contact surfaces can also be provided elsewhere on the photovoltaic roof tile, i.e. independently of the connecting elements.

The photovoltaic module is part of the upper face of the photovoltaic roof tile. In the installed state on the roof, the upper face is oriented toward the sky or the sun and is therefore regarded and referred to as the upper face of the photovoltaic roof tile. The lower face of the photovoltaic roof tile is arranged opposite the upper face. This lower face rests on the roof structure of the house or is connected to it. For example, the lower face of a photovoltaic roof tile rests on a roof batten. In this roof batten, the photovoltaic roof tile is also normally additionally secured with connecting elements, for example by connecting it with a nail or screw to the roof batten, which is normally made of wood.

The rear face in the installed state is to be understood as the upper lateral wall. The rear face of the solar energy roof tile is thus facing the ridge or the roof ridge on the roof structure. The opposite lateral wall of the solar energy roof tile, on the other hand, is to be understood as the front face. The front face is therefore the lower lateral wall in the installed state. The front face on a covered roof is thus facing the so-called gutter board of the roof.

Simple metal plates can be used as lateral walls, the front face, the rear face and also as the lower face. For example, the mentioned faces can be made substantially of aluminium and they can therefore be advantageously considered to be lightweight components. This considerably facilitates the handling ability of the roof tile. The production of the solar energy roof tile is also simplified, as the components in the form of the different walls or sheets, which are essentially arranged perpendicular to each other, can be simply plugged into each other and connected to one another, e.g. screwed or riveted. Alternatively or in addition, for example, several walls can be formed by providing a single sheet metal part. Thus, the lower face can be a sheet metal part, which provides the two lateral walls by bending the edges, or else the front and/or the rear face are realised by bending the respective end of the lower face formed as a metal plate.

The upper face can be constructed, for example, by a cover or structural unit which comprises the solar energy utilisation module or photovoltaic module. Apart from the outlet opening, the upper face can thus be constructed by means of a so-called glass package comprising the photovoltaic module. The cavity is then partially closed on the upper face by the glass package, while the outlet opening then simply corresponds to the part that is not closed by the glass package.

Due to the solar energy roof tile according to the disclosure, the production as well as the installation and maintenance are thus simple and inexpensive. The installation does not have to differ completely from the installation of standard roof tiles. The solar energy roof tiles can also be easily connected to standard roof tiles. Securing to the roof structure, for example, to the transverse running roof tiles, can also be carried out in the usual way by securing the solar energy roof tiles to the roof battens with a nail or screw. For example, this nail or screw can simply attach the solar energy roof tile to the roof batten via a locking plate attached to the rear face, extending downwards under the lower face.

In addition, standard securing elements can be used to connect the solar energy roof tiles to one another, for example commercially available storm suction protectors. The otherwise somewhat more complex connection of the electrical connecting elements of adjacent photovoltaic roof tiles can be realized in the present case simply by connecting the electrical connecting elements to each other by means of the inlet openings and the outlet openings of the adjacent photovoltaic roof tiles. The cavity provided within the photovoltaic roof tiles can be easily used to implement the connections. Access to the interior of the solar energy roof tiles, for example the photovoltaic roof tiles, via the inlet opening or via the outlet opening can also be used to maintain the solar energy roof tiles or photovoltaic roof tiles or carry out other types of repair work.

The cavity and the targeted heat transfer to the air flowing through the solar energy roof tiles, such as the photovoltaic roof tiles, also makes it possible to utilise the waste heat. The energy efficiency of houses covered with the solar energy roof tiles according to the disclosure can thus be further increased. The energy yield is improved by the solar energy roof tile according to the disclosure.

The dimensions of the inlet opening and the outlet opening can be selected. With regard to the dimensions extending between the two lateral walls, it may preferably be provided that the inlet opening extends essentially over the entire width between the two lateral walls. The outlet opening can also extend essentially over the entire width between the two lateral walls. The inlet opening and the outlet opening can preferably have an equal width extending between the two lateral walls. In this way, an optimal coverage of the inlet openings or outlet openings of adjacent solar energy roof tiles can be ensured. In addition, easy access to the interior of a solar energy roof tile can be ensured, which minimises the installation and maintenance costs.

In the dimension perpendicular thereto of the inlet opening or outlet opening, i.e. in the extension along a longitudinal direction running from the front face to the rear face, it can be provided that the inlet opening has a larger extension than the outlet opening along a longitudinal direction running from the front face to the rear face. This ensures that the ensuing smaller outlet opening of a solar energy roof tile is always located entirely in the overlap with a higher inlet opening of an adjacent solar energy roof tile. This ensures a secure through-flow of the heated ambient air from one solar energy roof tile to the next.

The properties of the inlet opening or outlet opening described above can be generally transferred to the provision of the upper opening in the upper face and the lower opening in the lower face in a solar energy roof tile, in particular with regard to the dimensions and sizes and the resulting advantages, particularly the installation advantages.

According to a preferred embodiment of the solar energy roof tile, the upper face is provided with a covering that can be displaced in a longitudinal direction running from the front face to the rear face. The covering can be formed by a sliding plate, which is held in the frame formed by the lateral walls or the front and rear faces. The moveable covering thus does not cover the entire upper face of the solar energy roof tile completely, but only partially. The outlet opening is also provided in the upper face which can be displaced by means of the sliding covering, so that it can sometimes be more covered and sometimes less covered. Thus, the cavity of the solar energy roof tile can then be made accessible from above or from outside at different positions. In this way, the cavity is made accessible from outside, not only through the outlet opening arranged near the rear face, but also on the opposite side near the front face. The covering can even be configured to be movable so far that the outlet opening arranged near the rear face is briefly closed and an opening is formed in the upper face near the front face. The covering can be formed by a glass package, which comprises the solar energy utilisation module, for example the photovoltaic module.

According to a further preferred embodiment of the solar energy roof tile, the lower face is essentially formed by a metal base plate and the metal base plate has at least one metal plate tab, preferably two metal plate tabs, in the region of the lower opening.

It can preferably also be provided that in an initial state of the solar energy roof tile, the metal plate tab extends essentially parallel to a ground plane of the metal base plate, and that the metal plate tab, when the solar energy roof tile is installed on a roof, has a vertical section which runs essentially perpendicular to the ground plane and a horizontal section which is connected to the vertical section and runs essentially parallel to the ground plane. The ground plane is the plane formed by the main part of the metal base plate. The initial state of the solar energy roof tile normally refers to the condition prior to installation. During the installation itself, the installer can then bend the metal plate tab and provide the vertical section as well as the horizontal section that is present when the solar energy roof tile has been installed. These sections can be used in an advantageous way to produce a connection between adjacent solar energy roof tiles and thus also particularly advantageously for storm suction protection as well as for potential equalization.

Furthermore, it may be preferable to provide the metal plate tab with a plurality of bores arranged at regular intervals. This has advantages with regard to the installation of the solar energy roof tiles on the roof, because in this way the metal plate tab can be simply provided with a screw or a connecting means and the connection to an adjacent solar energy roof tile arranged underneath it can be produced, for example, via the metal plate tab.

According to another preferred embodiment of the solar energy roof tile, an air slide valve is provided, which can be moved along a longitudinal direction running from the front face to the rear face and which is arranged in such a way that at least some regions of the inlet opening can be closed by the air slide valve. In this way, for example, the size difference between the inlet opening and the outlet opening described above can again be compensated. This is because the size and position of the inlet opening is thus designed to be variable. The air slide valve can be designed to rest on the inside of the lower face facing the cavity. The air slide valve can then be moved along this inside of the lower face. As a result, the inlet opening can be obscured by a greater or lesser amount. It is also possible for the inlet opening not to be covered by the air slide valve at all if the air slide valve is shifted along the longitudinal direction until it is behind the inlet opening. In an installed state, if two adjacent solar energy roof tiles are arranged in such a way that the outlet opening of one solar energy roof tile is brought into alignment with the inlet opening of the other solar energy roof tile, the two openings can be better aligned or brought into line with one another by means of the air slide valve. Due to the fact that the inlet opening can be modified by the air slide valve, the inlet opening of one solar energy roof tile can be adapted to the outlet opening of the solar energy roof tile underneath it in the installed state. In this way, differences in length which can inevitably occur in different roof structures can be compensated. In this way, roof battens may sometimes not be at a regular distance from one another, but may be spaced apart by a few centimetres more or less. In that case it could happen that an upper solar energy roof tile arranged on top in the installed state is too far away from the solar energy roof tile located below it, so that the inlet opening of the upper solar energy roof tile would be exposed to air flow not only through the outlet opening of the lower solar energy roof tile, but also by other air flowing in from the outside. However, this could be a disadvantage if the air that has flowed onto it has already warmed up but then mixes with colder air which penetrates through the overly large or not perfectly aligned inlet opening of the upper solar energy roof tile. Therefore, the adjustable air slide valve can also ensure an optimal heat transfer and thus improve the energy utilisation and energy efficiency of the system.

A preferred embodiment of the solar energy roof tile is characterized in that the air slide valve has a base section running essentially parallel to the lower face, that the air slide valve has a shoulder section extending from the base section essentially vertically upwards toward the upper face, and that in the shoulder section a through opening facing the rear face is provided. This means that the air slide valve can be easily moved along the lower face of the solar energy roof tile when the base section is resting on the lower face. Lateral guiding or rolling or sliding elements may also be provided to support the guidance of the air slide valve. The shoulder section provides an attack surface to the air slide valve, which allows the air slide valve to be easily moved along the longitudinal direction. The through opening can be used to connect further components, such as the storm suction protector described later with the shaft extending through the cavity, to the air slide valve and/or to couple the movements of the other component and the air slide valve together. Preferably, the air slide valve can have a roof section that is adjacent to the shoulder section and extends away from the base section, as well as a securing section, preferably with a through opening facing the front face in the securing section. This creates a trough-like receptacle between the starting section, the roof section, and the securing section of the air slide valve. This housing serves for example to accommodate other elements, such as a hook element, of the storm suction protector that has a shaft extending through the cavity, as will be explained later. Thus, the movement of the additional element or the storm suction protector can be simply coupled with that of the air slide valve. In addition, the trough-like housing can act as a receiving space or protection for other elements, for example a hook element of the storm suction protector, described later, that has a shaft extending through the cavity.

The solar energy roof tile according to the disclosure can be equipped with a storm suction protector, which can be connected, for example, to an adjacent solar energy roof tile in order to secure the solar energy roof tiles on a roof. Storm suction protectors, also known as wind suction protectors, are used to prevent the roof from being exposed by storms (wind suction). This is typically achieved by attaching a wire or a clamp to the roof tile, which anchors it to the roof batten. Anchoring is comparatively time-consuming; depending on local conditions, it sometimes takes more time than covering the roof tile itself. In addition, it is extremely difficult to replace such a roof tile (if it is damaged, for example) in the roof assembly (completely covered roof). The solar energy roof tile according to the disclosure can be secured with commercially available storm suction protectors. Alternatively, the present disclosure also provides new designs described below for a storm suction protector.

According to a particularly preferred embodiment of the solar energy roof tile, a storm suction protector which can be connected to an adjacent solar energy roof tile is provided, wherein the storm suction protector has a shaft extending through the cavity from the rear face toward the front face at least into the region of the inlet opening. The storm suction protector also has a hook element with an insertion tip at its end which is assigned to the inlet opening. The storm suction protector also comprises a receiving opening on its opposite end, which is assigned to the outlet opening, to accommodate an insertion tip of another storm suction protector of an adjacent solar energy roof tile. The storm suction protector formed in this way which is connected to the solar energy roof tile thus extends in a longitudinal direction running from the front face to the rear face, viewed from front to rear through the solar energy roof tile. The storm suction protector has a receiving opening on one side and a hook element with an insertion tip on the opposite side. This insertion tip can be e.g. a pin, a bolt element, a nail, a mandrel, or the like. This insertion tip can be introduced into the corresponding receiving opening of another, for example an adjacent, storm suction protector. Because a plurality of such storm suction protectors, each one having a shaft extending through the cavity, of a plurality of adjacent solar energy roof tiles can be connected to one another, namely simply plugged together, the adjacent solar energy roof tiles can also be connected to each other in a simple way and thus secured.

Such a storm suction protector used, having a shaft extending through the cavity according to the features described above, has separate inventive significance in isolation. Roof tiles other than the solar energy roof tile according to the disclosure can also be equipped with the described storm suction protector. In this respect, the storm suction protector can be provided as a retrofit component. For this purpose, the storm suction protector must be connected to the roof tiles so that the receiving opening of the storm suction protector is provided on one side and the hook element with the insertion tip on the opposite side. Commercially available roof tiles can then also be connected to each other with the described storm suction protector and thus secured against exposure. Preferably, only the roof tiles themselves or some of the roof tiles must then be fixed to the roof battens, for example in the usual way by means of nailing or also fixing screws in the wooden roof batten, and then the interconnection of the described storm suction protectors ensures that the roof does not become exposed. The storm suction protector described, having a shaft extending through the cavity, is therefore also novel and advantageous.

This also applies to the features described below of the storm suction protector having a shaft extending through the cavity. Such storm suction protectors, described below, also have their own inventive significance in isolation. In this respect, the advantages described above and below with regard to the solar energy roof tile, in particular their installation, also apply in part to other roof tiles which are equipped with such a novel and advantageous storm suction protector.

The insertion tip of the described storm suction protector, having a shaft extending through the cavity, is formed, for example, by a nail which is passed through a through hole in a base body of the hook element. This simplifies the installation of the storm suction protector or the corresponding roof tiles because the nail can only be guided through the through hole on site in order to establish the positive-fitting connection of the adjacent storm suction protectors and thus of the adjacent roof tiles.

A preferred embodiment of the storm suction protector, which has a shaft extending through the cavity, is characterized in that the hook element can be extended along the length of the shaft or that the shaft is formed as a longitudinally displaceable telescopic shaft. For example, the hook element can have a bore through which the shaft extends and through which the hook element is connected to the shaft in a longitudinally displaceable manner. Alternatively, the hook element can also be secured in a non-displaceable manner along the shaft, e.g. pressed on. Then, the shaft can also be designed as a telescopic shaft or else as a trumpet tube. In such a trumpet tube, two or more pipe sections of different diameters can be moved into each other. This allows the position of the hook element and thus of the insertion tip connected to it to be changed along the longitudinal direction. Thus, the installation of the solar energy roof tiles is considerably simplified. This is because a solar energy roof tile that is already placed on the roof underneath must be brought into alignment with a solar energy roof tile to be fitted above it in such a way that the insertion tip of the upper storm suction protector is inserted into the receiving opening of the lower storm suction protector. This is advantageous if the insertion tip of the upper storm suction protector is moved back briefly for installation along the shaft or together with the (telescopic) shaft and then, if the upper solar energy roof tile is aligned with the upper storm suction protector, is extended again and brought into a positive-fitting connection with the receiving opening of the lower storm suction protector.

According to another preferred embodiment of the storm suction protector having a shaft extending through the cavity, it is provided that a compression spring is arranged around the shaft, which holds the hook element in a position shifted toward the front face. This further simplifies the installation of the solar energy roof tiles on a roof. The reason being that the compression spring automatically forces the insertion tip into the receiving opening of the adjacent storm suction protector located underneath in the installed state, which also has a shaft extending through the cavity. A compression spring arranged around the shaft can be understood to mean that the compression spring is wound around the shaft. The shaft then extends centrally through the compression spring. The compression spring can be connected to the hook element arranged on the shaft. A displacement of the hook element on the shaft can therefore compress the compression spring.

The storm suction protector, which has a shaft extending through the cavity, can be fixed to the rear face at its end assigned to the rear face. For example, the shaft of the storm suction protector can be connected to the rear face. Only the receiving opening of the storm suction protector is left exposed, so that the insertion tip of a storm suction protector arranged above it can be re-inserted into this receiving opening. Additional securing elements may be provided to fix the storm suction protector to the rear face.

In addition, the storm suction protector which has a shaft extending through the cavity, in particular with the shaft, can extend at least through the through opening facing the rear face, preferably also continuing through the through opening facing the front face. This ensures a simple connection of the storm suction protector to the solar energy roof tile. Also, the movement or displacement of the storm suction protector, or the longitudinal displacement of the hook element of the storm suction protector, can be simply coupled with a displacement of the air slide valve. The alignment of the inlet opening and outlet opening, located one above the other, of two adjacent solar energy roof tiles can thus be carried out in a simple manner.

A preferred embodiment of the storm suction protector, which has a shaft extending through the cavity, is characterized in that the shaft is formed such that it can rotate about its longitudinal axis and/or that the hook element is rotatable around the shaft. In this way, a further degree of freedom can be provided for the position of the hook element and thus of the insertion tip. In an initial state, the hook element can be laterally pivoted, for example, and arranged essentially parallel to the lower face of the solar energy roof tile. For installation on the roof, this hook element can then be pivoted out of this position and protrude downwards from the lower face of the solar energy roof tile. In this way, the hook element with its insertion tip can then be easily brought into engagement with the receiving opening of the storm suction protector underneath it.

According to a further preferred embodiment of the storm suction protector, which has a shaft extending through the cavity, it is provided that a side of the hook element facing the rear face rests at least partially against one side of the shoulder section facing toward the front face. This enables a particularly simple and effective installation of the solar energy roof tiles. This is so because the side of the hook element facing the rear face automatically ensures that the air slide valve is displaced over the shoulder section when the hook element is moved lengthwise. In this way, a simple coupling is therefore achieved between the displacement of the hook element and the air slide valve.

As an alternative to the storm suction protector described, which has a shaft extending through the cavity, the proposed solar energy roof tile can particularly advantageously have a different, simple storm suction protector. The previously described metal plate tab or tabs in the metal base plate of the lower face can also serve as a storm suction protector in the described manner, as this means that adjacent solar energy roof tiles above and below can be mechanically connected to each other. In addition, a base-plate-mounted storm suction protection element can be advantageously provided, or even more advantageously two base-plate-mounted storm suction protection elements. These base-plate-mounted storm suction protection elements can be formed as nails or preferably as screws. The base-plate-mounted storm suction protection elements can fix the lower face of the solar energy roof tile or the metal base plate directly to the roof batten below in the installed state. Due to the advantageous openings in the shape of the upper opening in the upper face and the lower opening in the lower face of the proposed solar energy roof tile, these base-plate-mounted storm suction protection elements can also be easily accessed from above and mounted in the roof batten, or can also be removed again. The corresponding solar energy roof tile is thus secured to the roof batten by the base-plate-mounted storm suction protection elements and secured against, for example, storm-related exposure. In particular, in combination with the connection of adjacent solar energy roof tiles via the metal plate tabs described above, a particularly secure, storm-resistant system of solar energy roof tiles can be provided on a roof. For the base-plate-mounted storm suction protection elements, bores can be advantageously provided in the lower face or in the metal base plate of the solar energy roof tile.

A preferred embodiment of the solar energy roof tile is characterized in that the front face is designed to be pivotable, so that in the installed state the cavity can be accessed from the outside. In this way, the maintenance and installation of the solar energy roof tiles can be further simplified. For example, the electrical connection of plug and socket elements can be completed simply from the outside via the access of the folded down front face. Maintenance measures or visual inspections can also be easily carried out from the outside by means of this access.

For the mentioned electrical connection of adjacent solar energy roof tiles or, in particular, photovoltaic tiles, for example, a first electrical connecting element can be fixed on a side of the front face that faces the cavity. The installation and disassembly are thereby further simplified. This is because the electrical connection between solar energy roof tiles or photovoltaic roof tiles can be easily produced and released again, as the connections are easily accessible from the outside.

Furthermore, a second electrical connecting element can be arranged in the area of the outlet opening, wherein the second electrical connecting element can be configured for connection to the first connecting element of an adjacent solar energy roof tile or photovoltaic roof tile. Thus, the installation and disassembly are further simplified. This is because the electrical connection between solar energy roof tiles or photovoltaic roof tiles can be easily produced and released again, as the connections are easily accessible from the outside.

The solar energy system according to the disclosure is used to obtain energy from solar radiation. It can also be used simultaneously for utilising the waste heat. The solar energy system according to the disclosure comprises at least two solar energy roof tiles according to the disclosure connected together, wherein the upper opening of the solar energy roof tile arranged underneath in the installed state is at least partially aligned with the lower opening of the solar energy roof tile arranged on top in the installed state.

In this way, a system is provided by means of which a roof with the solar energy roof tiles according to the disclosure can be covered in such a way that not only is the solar radiation successfully used for generating electrical or thermal energy, for example, but also the waste heat is technically used in the household in a simple manner. The advantages described previously in connection with the solar energy roof tiles according to the disclosure also apply to the solar energy system according to the disclosure.

A solar energy system can be understood to mean in particular a photovoltaic system. It can also refer to a solar thermal energy system. A combination of photovoltaic and solar thermal technologies can also be used in a solar energy system.

A roof is normally covered in such a way that a solar energy roof tile, located at the bottom in the installed state, is first fixed to the roof structure, secured in a roof batten by means of a nail or a screw, for example. However, the solar energy roof tiles can also be easily hung on a roof batten by hooking one or more rear-mounted batten retainers that protrude from the lower face of the roof tile on the roof batten from above. Thus, the securing by means of a nail or screw in the roof batten is not absolutely necessary, or can also be done later if necessary. A further solar energy roof tile is then mounted over the previous one. The connection can then be advantageously produced between the two, for example by engaging the hook element of the storm suction protector, which has a shaft extending through the cavity, of the upper solar energy roof tile with the receiving opening of the storm suction protector, which has a shaft extending through the cavity, of the lower solar energy roof tile. This, as well as the production of the electrical connections, can also be carried out in advantageously via the upper opening or outlet opening of the upper solar energy roof tile. The alternatively described storm suction protector can also be used, for example, by connecting the metal plate tab of the upper solar energy roof tile to the lower face or the metal base plate of the lower roof tile, preferably via the potential equalisation elements. The base-plate-mounted storm suction protection elements can also be provided and secured in the roof batten. These assembly tasks in the form of the provision of the potential equalisation elements as well as the base-plate-mounted storm suction protection elements are considerably simplified by the presence of the upper openings or outlet openings as well as lower openings or inlet openings.

A preferred embodiment of the solar energy system is characterized in that a consumer, in particular in the form of a heat pump or heat exchanger, which uses the heat energy provided by the heated ambient air, is directly connected to the upper opening of the solar energy roof tile that is arranged uppermost in the installed state. This provides a system that makes even better use of the energy provided by solar radiation.

For example, the ridge or roof ridge is connected to the topmost solar energy roof tiles arranged on a roof. A cavity can then be provided in the roof ridge, which is aligned with the upper opening or outlet opening of the topmost solar energy roof tile. The edge of the roof ridge closes the topmost upper opening or outlet opening against the environment, forming a seal. Toward the inside, in the direction of the house, the heated ambient air is then sucked through the cavity of the roof ridge and used in the house, for example. Additional blower elements can also be provided. These can also be provided, for example, in lower solar energy roof tiles and actively ensure that the air flowing through the solar energy roof tile and thereby heating up is directed further upwards toward the roof ridge. A perforated plate, which covers the lower opening or inlet opening, can also be provided below the bottom solar energy roof tile. On the one hand, this ensures the desired intake or through flow of the ambient air, but on the other hand it prevents unwanted objects or even wildlife from entering the cavity of the solar energy roof tiles. In particular, in the solar energy roof tile located at the bottom in the installed state, or outside of it, an intake element or blower element can be provided which ensures that ambient air enters the cavity of this solar energy roof tile. A flap can also be provided in the roof ridge to allow the heated ambient air flowing through the solar energy roof tiles to be released to the environment again if necessary. The flap can be manually operated or automatically controlled. This flap can be opened, for example, if too much heat would otherwise be provided by the heated ambient air, which cannot be used in the household at all.

According to a further embodiment of the solar energy system, a potential equalisation element may be provided, which extends at least partially at least through the two lower faces of the at least two lower faces of the interconnected solar energy roof tiles, the potential equalisation element preferably being arranged in such a way that the potential equalisation element connects the metal base plate of the solar energy roof tile arranged underneath in the installed state to the metal plate tab of the solar energy roof tile arranged above it in the installed state. This potential equalisation element may be implemented, for example, as a screw or a nail. On the one hand, it serves to provide the mechanical connection between adjacent solar energy roof tiles. Thus, it also acts as a storm suction protector. Furthermore, it can connect adjacent solar energy roof tiles, in particular in the area of their metal base plates, in such a way that the housings of the adjacent solar energy roof tiles are thereby electrically conductively connected to each other. For this purpose, for example, both the base plate and the plate tab as well as the potential equalisation element can be metallic. This ensures a potential equalisation and, for example, an earthing can finally be provided.

The method according to the disclosure is used to obtain energy from solar radiation while simultaneously utilising the waste heat. In the method according to the disclosure, by means of a solar energy roof tile, preferably according to disclosure, thermal and/or electrical energy is produced from solar radiation using a solar energy utilisation module and the waste heat thereby generated due to heating of the solar energy utilisation module is discharged to the ambient air flowing past and the heated ambient air is delivered to a consumer, in particular in the form of a heat pump or heat exchanger.

This provides a method that uses the energy provided by solar radiation even more efficiently. Not only is electrical energy or electricity generated in a solar energy utilisation module, such as a photovoltaic module in a photovoltaic roof tile, but also the waste heat from the photovoltaic modules that are heated is used and deployed as required. The advantages described above with regard to the photovoltaic roof tile according to the disclosure also apply correspondingly to the method according to the disclosure, in particular when using the photovoltaic roof tile according to the disclosure.

A preferred embodiment of the method is characterized in that a plurality of solar energy roof tiles, preferably in a solar energy system according to the disclosure, are provided and mounted on a roof structure, that ambient air is drawn in by the solar energy roof tile arranged at the bottom in the installed state, that the ambient air drawn in is fed through the outlet opening and the inlet opening of respectively adjacent solar energy roof tiles through the cavities of the adjacent solar energy roof tiles, and that the heated ambient air is drawn from the solar energy roof tile arranged uppermost in the installed state and then fed to a consumer. Adjacent roof tiles are again to be understood to mean adjacent roof tiles above and below. The energy provided by the solar radiation is thus used in a targeted manner both for producing electrical energy in the form of electricity and for using heat. In this case, the ambient air can be drawn in and extracted or pumped out, first as colder air and then as heated air, either passively or actively. Additional suction and/or discharge elements may be provided to support the suction and transport of the ambient air. However, the flow of ambient air through the solar energy roof tiles can also be implemented in a purely passive manner. It is thus possible to positively exploit the effect that the ambient air being heated up in the lowest solar energy roof tile automatically rises upwards and thus flows toward the outlet opening of the lowest solar energy roof tile. Above this, the warming ambient air then enters the solar energy roof tile arranged directly above it, where the heated ambient air continues to heat up, and so on.

BRIEF DESCRIPTION OF THE DRAWINGS

The disclosure will be explained in further detail by reference to the attached drawings. These show a preferred exemplary embodiment of the disclosure, which is not intended to limit the disclosure to the features shown. Shown are:

FIG. 5: the photovoltaic roof tile according to FIG. 2 in a frontal view, FIG. 6: the photovoltaic roof tile according to FIG. 5 in longitudinal section according to the cutting lines A-A, wherein a detail enlargement is additionally shown.

DETAILED DESCRIPTION OF THE DRAWINGS

In the following, the disclosure is discussed using the example of a photovoltaic roof tile. The disclosure is not limited to this type of solar energy roof tile, however. The advantages also arise in particular with solar thermal roof tiles and also with combined roof tiles which use photovoltaic and solar thermal energy. In particular, the following advantages relating to the production of electrical connections in photovoltaic roof tiles are also transferable to the production of thermal connections between adjacent solar thermal roof tiles. In the case of solar thermal roof tiles, fluid lines are provided instead of electrical lines. Accordingly, instead of electrical connections, coupling elements are required for connecting the fluid-carrying pipes, which are connected to each other in the same way as the electrical connections when laying the roof tiles.

Figure 1:
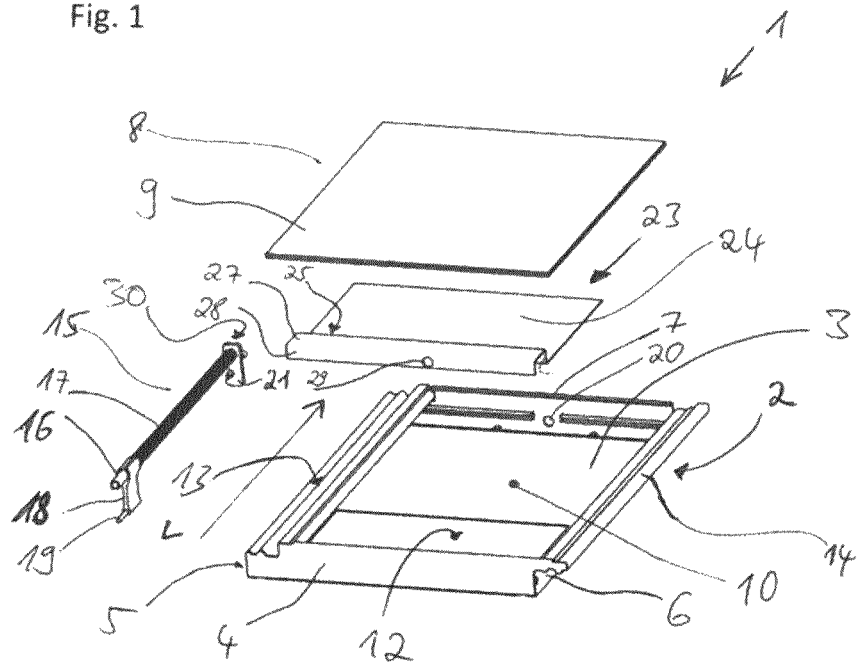
FIG. 1: a solar energy roof tile according to the disclosure in the form of a photovoltaic roof tile in an exploded view.

FIG. 1 shows a preferred embodiment of a photovoltaic roof tile 1 according to the disclosure in an exploded view. The photovoltaic roof tile 1 first comprises a basic framework shown at the bottom. For example, the photovoltaic roof tile 1 comprises a lower face 2 (indicated by the arrow), which is essentially formed by the metal base plate 3. The lower face 2 is used to support the photovoltaic roof tile 1, at least in some sections, on a roof structure, not shown. In addition, the photovoltaic roof tile 1 has a front face 4, two opposite lateral walls 5 and 6, and a rear face 7 opposite the front face 4. The front face 4 and the rear face 7 connect the two lateral walls 5, 6 to each other.

Furthermore, the photovoltaic roof tile 1 has an upper face 8, which is essentially formed from the glass package 9. Part of this glass package 9 is, among other things, a photovoltaic module that generates electrical energy from solar radiation in the known manner. The upper face 8 and the lower face 2 connect together the two lateral walls 5, 6, the rear face 7 and the front face 4 so that a cavity 10 is formed in the photovoltaic roof tile 1.

Figure 2:
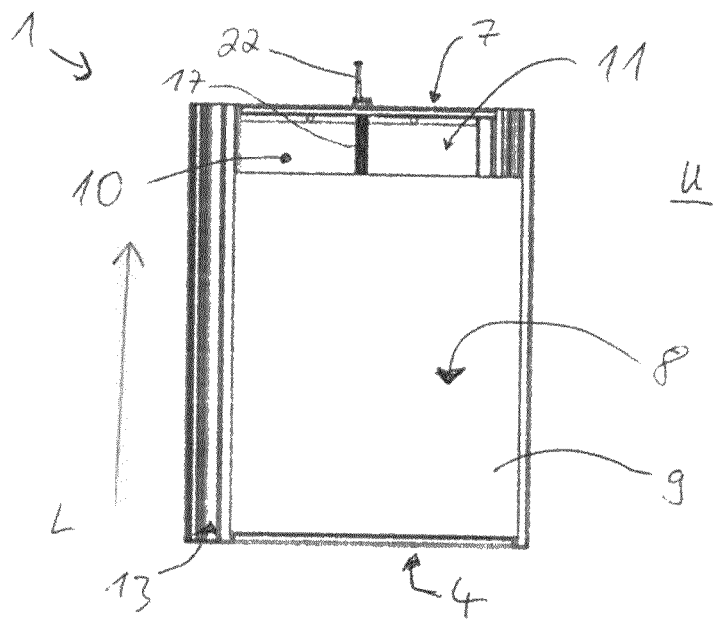
FIG. 2: the photovoltaic roof tile from FIG. 1 in an assembled state in a plan view.

The upper face 8 of the photovoltaic roof tile 1 is not completely closed by the glass package 8. As shown in FIG. 2, which shows a plan view of the photovoltaic roof tile 1 from FIG. 1 in an installed state, the upper face 8 has an outlet opening 11 in the region of the rear face 7. This outlet opening 11 makes the cavity 10 of the photovoltaic roof tile 1 accessible from the outside.

The glass package 9 forms a covering for the photovoltaic roof tile 1. This covering partially closes off the cavity 10 on the upper face 8 of the photovoltaic roof tile 1. The outlet opening 11 is formed by the part that is not closed off by the glass package 9.

The position of the outlet opening 11 in the upper side 8 is variable because the covering or the glass package 9 is designed to be displaceable along a longitudinal direction L running from the front face 4 to the rear face 7. From the state shown in FIG. 2, the glass package 9 can be shifted in the longitudinal direction L, so that the outlet opening 11 is reduced in size. At the same time, however, this will allow further access to the cavity 10 of the photovoltaic roof tile 1. By displacing the glass package 9 on the upper face 8 of the photovoltaic roof tile 1, the cavity 10 is also made accessible from the outside near the front face 4. The ability to displace the covering or the glass package 9 thus facilitates installation or maintenance work, because the cavity 10 of the photovoltaic roof tile 1 can thus be made accessible from the outside at different points as required.

As shown in FIG. 1, the lower face 2 also comprises an opening in the form of the inlet opening 12. The cavity 10 of the photovoltaic roof tile 1 can also be accessed from the outside via this inlet opening 12.

Essential to the present disclosure is the finding that the cavity 10 of the photovoltaic roof tile 1 can be used due to the fact that it is now accessible from the outside by means of the mentioned openings, inlet opening 12 and outlet opening 11. Thus, the inlet opening 12 serves to allow ambient air flowing from the surroundings U to enter the cavity 10 of the photovoltaic roof tile 1. There, this ambient air then flows in the direction of the outlet opening 11 of the photovoltaic roof tile 1. On this flow path, the ambient air passes through, among other things, the glass package 9 or the photovoltaic module, which heats up strongly during operation. The energy from this heating is utilised by releasing the waste heat to the ambient air flowing through the cavity 10 of the photovoltaic roof tile 1. The ambient air heated in this way can be exploited technically, for example, in heat pumps or other consumers downstream of the photovoltaic roof tiles 1.

For this purpose, several photovoltaic roof tiles 1 can be connected in series, from bottom to top as seen on a roof structure, so that the outlet opening 11 of a lower photovoltaic roof tile 1 is always brought into alignment with the inlet opening 12 of an adjacent photovoltaic roof tile 1 arranged above it. Several photovoltaic roof tiles 1 can also be provided laterally adjacently on a roof. For this purpose, laterally adjacent photovoltaic roof tiles 1 can be connected to each other at least in a positive-fitting manner via the support section 13 provided on the lateral wall 5 and the clamping section 14 provided on the lateral wall 6. The photovoltaic roof tiles 1 can also be connected together laterally to standard roof tiles. For this purpose, the commercially available roof tiles must also have only the matching counterparts in the form of a support section 13 and a clamping section 14. For this reason, the photovoltaic roof tile 1 according to the disclosure also has dimensions and an external shape which essentially correspond to the shape and dimensions of a conventional roof tile.

Electrical connecting elements, for example in the form of a plug and a socket, via which the adjacent photovoltaic roof tile 1 can be electrically connected to each other, are not shown in the present exemplary embodiment.

A so-called storm suction protector 15 is provided for connecting or securing several photovoltaic roof tiles 1 mounted on a roof. The storm suction protector 15 described and explained in the following has its own inventive significance. Under certain conditions, this storm suction protector 15 can also be used with commercially available roof tiles.

In the exemplary embodiment shown here, which is preferred in this respect, the photovoltaic roof tile 1 has the storm suction protector 15. In the assembled state, this storm suction protector 15 extends through the cavity 10 from the rear face 7 toward the front face 4 at least into the region of the inlet opening 12.

The storm suction protector 15 has a shaft 16 extending along the longitudinal direction L. A compression spring 17 is arranged around this shaft 16. On the end of the shaft 16 facing the front face 4 a hook element 18 of the storm suction protector 15 is arranged.

The hook element 18 is designed to be displaced lengthwise along the shaft 16. The hook element 18 can be moved back along the longitudinal direction L on the shaft 16, compressing the compression spring 17. However, in its initial state, the hook element 18 is held by the compression spring 17 in the position shown, shifted toward the front face 4.

An insertion tip 19 is provided on the hook element 18. The insertion tip 19 in this case is a nail. It can also be e.g. a pin, a bolt element, a mandrel, or the like. The insertion tip can be inserted into a corresponding receiving opening of another, for example adjacent, storm suction protector (explained in more detail later in connection with the receiving opening 30). Because a plurality of such storm suction protectors of a plurality of adjacent photovoltaic roof tiles 1 can be connected to one another, namely simply plugged together, the adjacent photovoltaic roof tiles 1 can also be connected to one another in a simple way and thus secured.

The fact that the insertion tip 19 of the storm suction protector 15 described here is formed as a nail, which, as shown in FIG. 6, is guided through a through hole through a base body of the hook element 18, simplifies the installation of the storm suction protector 15 or the corresponding roof tiles 1. This is because the nail or insertion tip 19 can only be guided through the through hole on site in order to establish the positive-fitting connection of the adjacent storm suction protectors 15 and thus of the adjacent roof tiles 1.

Figure 3:
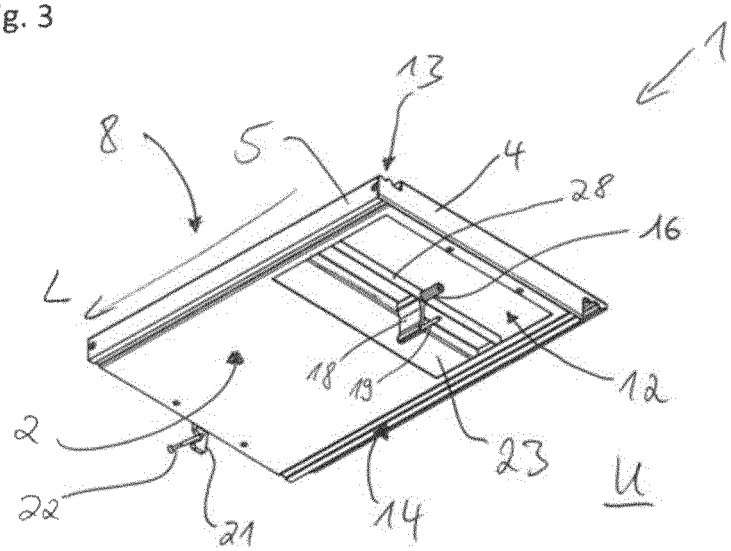
FIG. 3: the photovoltaic roof tile according to FIG. 2 in a perspective view from below.
Figure 4:
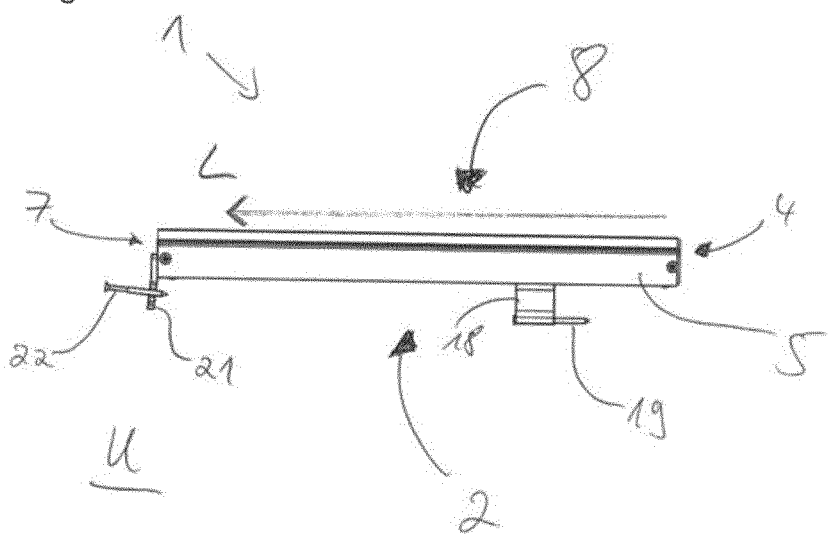
FIG. 4: the photovoltaic roof tile according to FIG. 2 in a side view.

In the assembled state, the storm suction protector 15 is fixed to the rear face 7 of the photovoltaic roof tile 1. To this end, the rear face 7 has a bore 20, through which the shaft 16 of the storm suction protector 15 is routed. In addition, the storm suction protector 15 also has a securing plate 21, via which the storm suction protector 15 and ultimately also the photovoltaic roof tile 1 can be fixed to a roof batten of a roof structure. For this purpose, the photovoltaic roof tile 1 is securely connected to the roof batten by means of a nail or, as can be seen in FIGS. 2, 3 and 4, by means of a screw 22 using the securing plate 21.

The photovoltaic roof tile 1 additionally has an air slide valve 23. The air slide valve 23 can at least partially close the inlet opening 12 if necessary, as can be seen in FIG. 3 which shows the photovoltaic roof tile 1 in a perspective view from below. The air slide valve 23 can be moved along the longitudinal direction L and thus increase or decrease the size of the inlet opening 12. For this purpose, the air slide valve 23 is designed to be movable in its entirety. The air slide valve 23 can also be moved far enough back along the longitudinal direction L that the inlet opening 12 is not closed by the air slide valve 23 at all, i.e. not even partially. The air slide valve 23 is then completely above the base plate 3 and does not protrude past the inlet opening 12, viewed opposite to the longitudinal direction L.

The longitudinal movement of the air slide valve 23 is coupled with the movement of the storm suction protector 15 or the hook element 18. Thus, the air slide valve 23 firstly comprises a base section 24. The base section 24 runs essentially parallel to the lower face 2 or to the base plate 3. The base section 24 can slide along the base plate 3 to allow the longitudinal displacement.

The air slide valve 23 also has a shoulder section 25 extending from the base section 24 essentially vertically upwards toward the upper face 8. A side 26 of the hook element 18 facing the rear face 7 rests against one side of the shoulder section 25 facing the front face 4, as can be seen from the enlarged view of a detail in FIG. 6. In this way, a displacement of the hook element 18 also automatically ensures a displacement of the air slide valve 23 at the same time, by virtue of the hook element 18 pressing against the shoulder section 25 of the air slide valve 23.

The shoulder section 25 also has a through opening, through which the shaft 16 of the storm suction protector 15 extends.

The air slide valve 23 comprises a roof section 27 connected to the shoulder section 25. The roof section 27 is essentially perpendicular to the shoulder section 25 and essentially parallel to the base section 24. A securing section 28, which is essentially perpendicular to the roof section 27 and extends again downwards toward the lower face 2, is connected to the roof section 27. In this securing section 28, a through opening 29 is also provided, namely a through opening 29 facing the front face 4 and through which the shaft 16 of the storm suction protector 15 is also guided.

At its opposite end, the shaft 16 is fixed to the rear face 7 of the photovoltaic roof tile 1. As can be seen from the detail enlargement in FIG. 6, a longitudinal displacement of the hook element 18 does not change the position of the shaft 16 of the storm suction protector 15. Instead, the hook element can be moved along the shaft 15, causing the shoulder section 25 of the air slide valve 23 to also move and compressing the compression spring 17 at the same time. The installation of the photovoltaic roof tiles 1 is thereby further facilitated.

Thus, a roof is normally covered in such a way that a photovoltaic roof tile 1, located at the bottom in the installed state, is first fixed to the roof structure, secured in a roof batten by means of a nail or, as shown in this case, the screw 22. Alternatively, the photovoltaic roof tile 1 could also be merely hooked onto a roof batten from above with the securing plate 21, without additionally being screwed into it with the screw 22.

A further photovoltaic roof tile 1 is then mounted over the previous one. The connection can then be advantageously produced between two photovoltaic roof tiles 1 by engaging the hook element 18 of the storm suction protector 15 of the upper photovoltaic roof tile 1 with a receiving opening 30 of the storm suction protector 15 of the lower photovoltaic roof tile 1.

Figure 7:
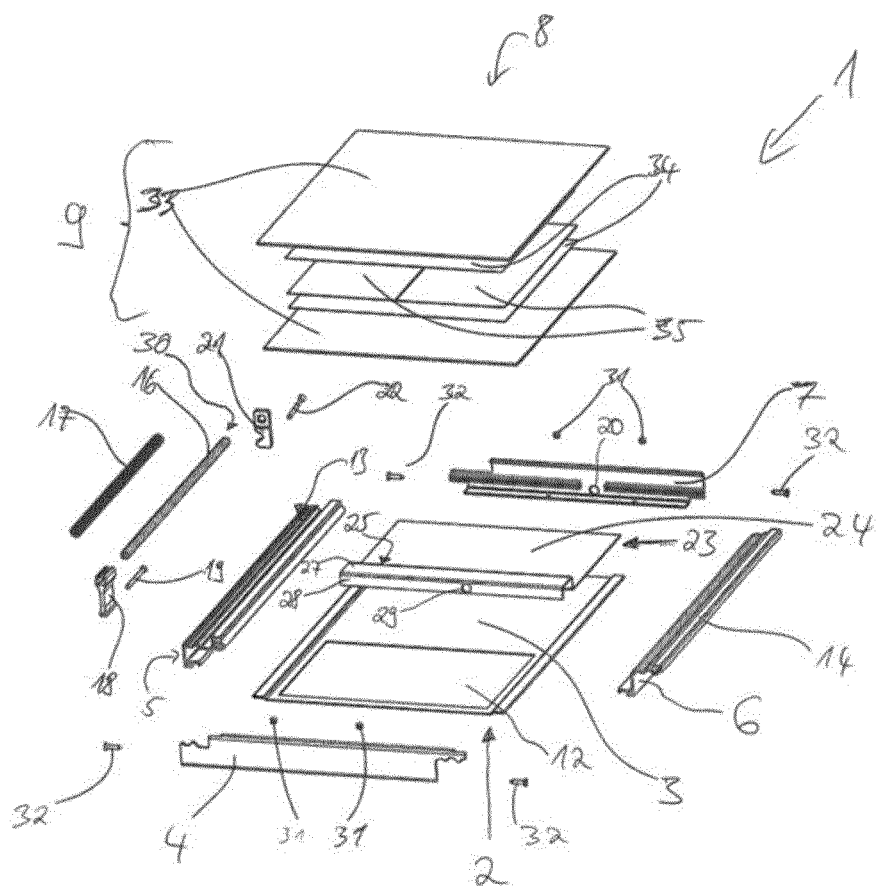
FIG. 7: a solar energy roof tile according to the disclosure in the form of a photovoltaic roof tile in an exploded view, FIG. 8 a detail of a roof covered with solar energy roof tiles in the form of photovoltaic roof tiles in plan view, FIG. 9 a further exemplary embodiment of a proposed solar energy roof tile in the form of a photovoltaic roof tile.

The receiving opening 30 thus corresponds to the insertion tip 19 of a storm suction protector 15. The receiving opening 30 is indicated in FIGS. 1 and 7 and in particular can be seen in FIG. 6. The receiving opening 30 is formed by using a hollow shaft as the shaft 16. The central opening of this hollow shaft at the end of the shaft 16 assigned to the rear face 7 thus serves as the receiving opening 30 for the insertion tip 19 of an adjacent storm suction protector 15.

These installation tasks, as well as the production of the mentioned electrical connections, can also be advantageously carried out in an easily manageable manner vie the outlet opening 11 of the upper photovoltaic roof tile 1.

The compression spring 17 holds the hook element 19 in its position shifted toward the front face 4 and thus simultaneously ensures that the insertion tip 19 of a photovoltaic roof tile 1 arranged above in the covered roof is held in the receiving opening 30 of a photovoltaic roof tile 1 arranged underneath.

The storm suction protector 15 described can also be referred to as the storm suction protector 15 which has a shaft 16, in order to distinguish it from the alternative storm suction protector described later in connection with the exemplary embodiment from FIG. 8.

FIG. 7 shows the photovoltaic roof tile 1 in a further enlarged exploded view. Individual rivets 31 as well as screws 32 can be identified, which are used to connect the lateral walls 5, 6, the front face 4, the rear face 7, and the base plate 3. Furthermore, the glass package 9 essentially forming the upper face 8 is shown in its individual parts. The glass package 9 has an upper and a lower glass plate 33, between which an upper and a lower ethylene-vinyl-acetate film 34 is arranged. Two adjacent solar cells 35, essentially formed from silicon nitride, are arranged in these two ethylene-vinyl-acetate films 34. This forms the photovoltaic module which is used in the present case to generate electrical energy from solar radiation.

The glass package 9 heats up strongly due to the solar radiation and its operation. Waste heat is produced, which is used specifically by the present photovoltaic roof tile 1. For example, through the inlet opening 12 ambient air is drawn in from the surroundings U and flows through the cavity 10 of the photovoltaic roof tile 1 and exits again from the outlet opening 11, now as heated air. This heated air can then be used specifically in consumers such as heat pumps and the like.

In order that the warming air flowing through the cavity 10 of the photovoltaic roof tile 1 does not escape unused from the photovoltaic roof tile 1, the components lower face 2 or base plate 3, lateral walls 5, 6, front face 4, rear face 7 and upper face 8 or glass package 9, are connected together or sealed in an airtight manner.

Figure 8:
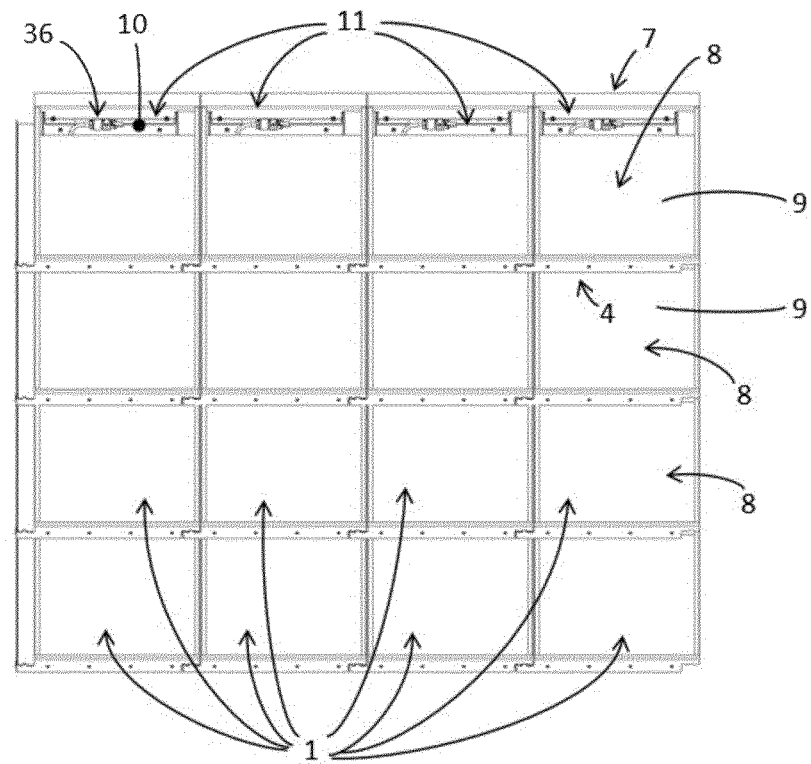

FIG. 8 shows an example of an extract of a roof covered with photovoltaic roof tiles 1. Four rows are shown, each with four photovoltaic roof tiles 1 arranged on top of one another, wherein only the lower two rows of photovoltaic roof tiles 1 are labelled with the reference sign 1. In the plan view shown of the upper faces 8 of the photovoltaic roof tiles 1, the glass packages 9 of the photovoltaic roof tiles 1 can be identified. Furthermore, the topmost row of photovoltaic roof tiles 1 allows the outlet openings 11 to be identified. Access to the cavity 10 of the photovoltaic roof tiles 1 is ensured via these outlet openings 11.

Access to the cavity 10 of a photovoltaic roof tile 1 provides the particular advantage that further installation and maintenance measures are easily possible after the basic roof installation. In this way, the roof can also be fitted initially by a roofer. The proposed photovoltaic roof tiles 1 can be laid on the roof like a normal roof tile. This activity may be carried out by a roofer without special additional training. After that, the electrical connection of adjacent photovoltaic roof tiles 1, or maintenance measures generally, in particular related to the electrical components, can be carried out by specially trained personnel. To form the covering, the photovoltaic roof tiles 1 can therefore be subsequently screwed in place and connected by a roofer, e.g. by a solar engineer or a roofer with additional training, for which the ability to displace the covering, or here the glass package 9, of the respective photovoltaic roof tile 1 is advantageous.

Access to the cavity 10 of a photovoltaic roof tile 1 is ensured permanently, mainly by the fact that both the lower face 2 has a lower opening in the form of the inlet opening 12 and the upper face 8 has an upper opening in the form of the outlet opening 11. It is particularly advantageous that the upper face 8 has a covering that can be displaced in the longitudinal direction. In this case, this covering is formed by the glass package 9 itself.

As can be seen from the top row of photovoltaic roof tiles 1, the electrical components 36 of the photovoltaic roof tiles 1 are provided in the cavity 10 of the photovoltaic roof tiles 1. With an already covered roof, the electrical components 36 of adjacent photovoltaic roof tiles 1 can be advantageously connected to the adjacent electrical components 36 of adjacent photovoltaic roof tiles 1 quite simply in the proper manner. Access to the cavity 10 is variable in particular because the glass package 9 can simply be moved upwards and, as a result, the outlet opening 11, which is actually arranged above the rear face 7 of the photovoltaic roof tile 1, now provides another upper opening to the cavity 10 further down near the front face 4 and thus also allows access to the cavity 10 of the photovoltaic roof tile 1 allowed near the front face 4. This can then be used to create direct access into the photovoltaic roof tile 1 underneath, specifically via the outlet opening 11 of this adjacent photovoltaic roof tile 1 below.

Figure 9:
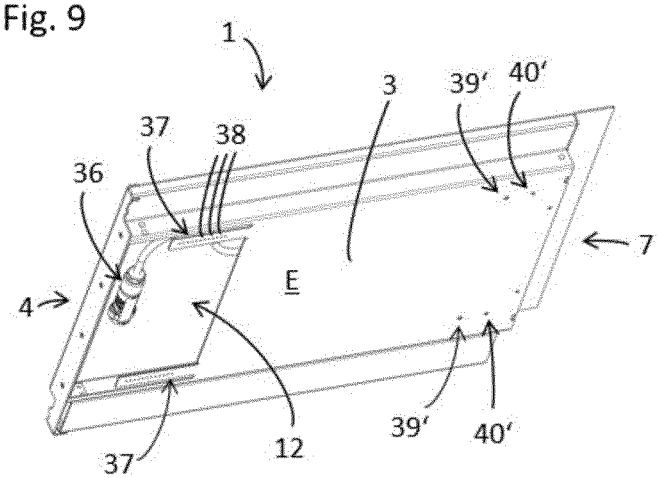

FIG. 9 shows another exemplary embodiment of a photovoltaic roof tile 1, which is only partially shown in FIG. 9, however. In FIG. 9 the base plate 3 can be identified in particular. Such a photovoltaic roof tile 1 or a photovoltaic roof tile 1 with such a base plate 3 can be used when covering the roof, as previously described using the example of FIG. 8.

In contrast to the exemplary embodiment shown earlier, in the initial state of the photovoltaic roof tile 1 shown here, the base plate 3, which is present on a roof before the installation, has two metal plate tabs 37 extending toward the front face 4 of the photovoltaic roof tile 1 and arranged in the region of the inlet opening 12. In the initial state of the photovoltaic roof tile 1 as shown in FIG. 9, these metal plate tabs 37 extend essentially parallel to the ground plane E of the base plate 3. The two metal plate tabs 37 are again also arranged parallel to each other. In addition, the metal plate tabs 37 have a plurality of bores 38 arranged at regular intervals, only some of which are labelled with the reference sign 38 in FIG. 9. Specifically, in the exemplary embodiment shown, each metal plate tab 37 has twelve bores 38.

In addition, in the region of the rear face 7 of the photovoltaic roof tile, 1 further bores are provided, which are necessary in particular for mounting the components shown later on the roof. In FIG. 9 and also in FIG. 10, two storm suction protection bores 39' are provided, as well as two batten support bracket bores 40'. These are provided for the components to be shown later in FIGS. 11 and 12 in the form of the base-plate-mounted storm suction protection elements 39, as well as the batten retainers 40. The functionality of these components, as well as the potential equalisation elements 41 also shown in FIGS. 11 and 12, will be described in particular in the context of the photovoltaic roof tiles 1 shown in the installed state on a roof in connection with FIG. 12.

In the exemplary embodiment shown and described further below, as shown, the components used in the context of the photovoltaic roof tile 1 described earlier in FIGS. 1 to 7, in the form of the storm suction protector 15 having the shaft 16 and also the air slide valve 23, can also be dispensed with if required.

Figure 10:
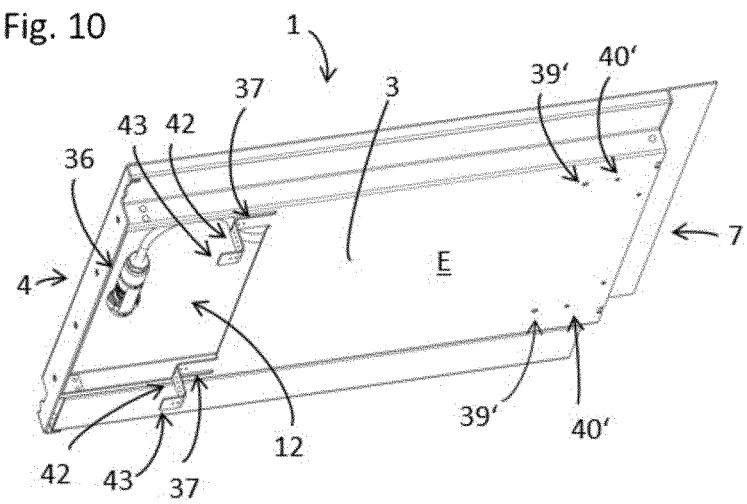
FIG. 10 the exemplary embodiment according to FIG. 9, shown in an installed state, FIG. 11 side views of the drawings from FIG. 9 (in view a) of FIG. 11), as well as from FIG. 10 (in view b) of FIG. 11), and FIG. 12 a side view of several adjacent photovoltaic roof tiles according to FIGS. 8 to 11 installed on a roof (in view a) of FIG. 12), also in an enlarged detail view B (in view b) of FIG. 12).

FIG. 10 shows the exemplary embodiment according to FIG. 9, but now shown in an installed state, i.e. in a state in which the photovoltaic roof tile 1 is mounted on a roof. In contrast to FIG. 9, the two metal plate tabs 37 are now designed to fit the adjacent additional photovoltaic roof tile, not shown in FIG. 10, arranged below the photovoltaic roof tile 1. In comparison to the initial state according to FIG. 9, the respective metal plate tab 37 is firstly bent downwards by essentially 90°, and then bent upwards once again by essentially 90°. Accordingly, the metal plate tabs 37 each have a vertical section 42 which runs essentially perpendicular to the ground plane E of the base plate 3 or perpendicular to the roof in the installed state, and a horizontal section 43 connected to this vertical section 42 and running essentially parallel to the ground plane E of the base plate 3 or parallel to the roof in the installed state.

Figure 11:
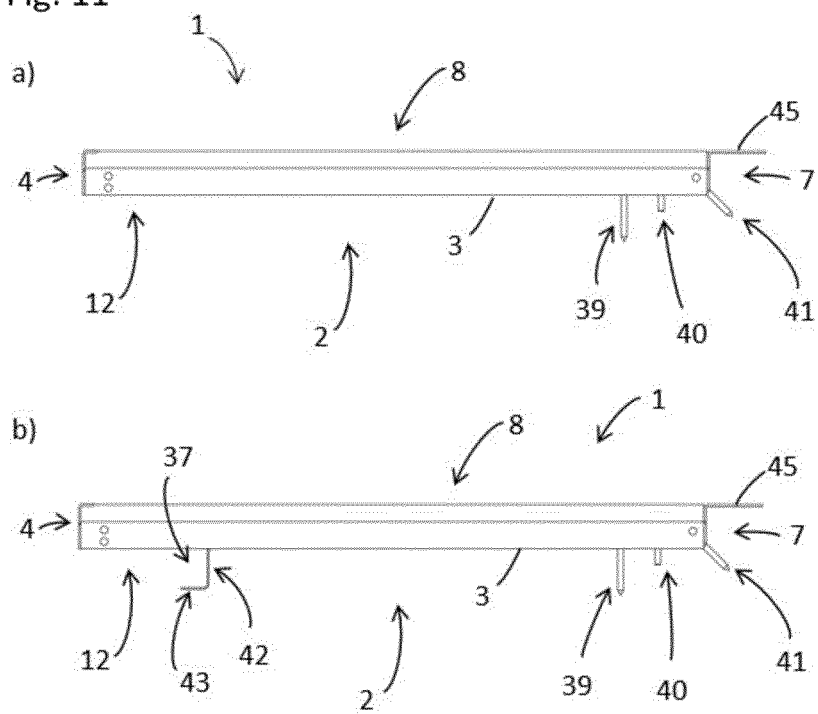

FIG. 11 shows side views of the drawings of the photovoltaic roof tiles 1 from FIG. 9 (in view a) of FIG. 11), as well as from FIG. 10 (in view b) of FIG. 11). In addition to the illustrations of FIGS. 9 and 10, however, the elements base-plate-mounted storm suction protection element 39, batten retainer 40, and potential equalisation element 41 can now also be seen. It is clear that the storm suction protection element 39 on the base-plate side extends essentially vertically downwards from the base plate 3. Likewise, the batten retainer 40 extends essentially vertically downwards from the base plate 3. Finally, the potential equalisation element 41 is arranged in a corner in a transition region between the base plate 3 and the rear face 7 and extends diagonally downwards and backwards in relation to the view of the photovoltaic roof tile 1 shown.

The components base-plate-mounted storm suction protection element 39, batten retainer 40 and potential equalisation element 41 can preferably be loose components, provided separately or distinct from the base plate 3 or the photovoltaic roof tile 1. Thus, the base-plate-mounted storm suction protection element 39 can be a nail or a screw, by means of which the photovoltaic roof tile 1 can be mounted on a roof batten, not shown in FIG. 11, via the base plate 3 through the bore 39'. For example, the batten retainer 40 can be a, preferably metal, pin or a screw, which pin or screw can be inserted in the base plate 3 through the bore 40' and can provide protection as a stop from above against a roof batten, not shown in FIG. 11. The potential equalisation element 41 can also be implemented as a nail or a screw. The potential equalisation element 41 can extend through the base plate 3 or the transition between base plate 3 and rear face 7 of a photovoltaic roof tile 1, as well as simultaneously through a metal plate tab 37 of an upper adjacent photovoltaic roof tile. This potential equalisation element 41 then also partially serves to connect two adjacent (above and below) photovoltaic roof tiles 1 to each other and thus also contributes partly to the storm suction protection. The potential equalisation element 41 can be introduced during the installation and connection of two adjacent photovoltaic roof tiles 1 to each other through a bore 38 of the metal plate tab 37 and then connect this metal plate tab 37 of the upper adjacent photovoltaic roof tile 1 to the base plate 3 of the lower adjacent photovoltaic roof tile 1.

The three components of the base-plate-mounted storm suction protection element 39, batten retainer 40, as well as potential equalisation element 41 can also be seen in FIG. 12 in detail and in use, i.e. in an installed state of the illustrated photovoltaic roof tiles 1 on a roof. In view a) the three photovoltaic roof tiles 1 are fully visible and a further photovoltaic roof tile 1 is partly visible at the lower left edge, wherein these photovoltaic roof tiles 1 are mounted on a roof which is indicated by the four roof battens 44.

For installation, the roof is covered with the photovoltaic roof tiles 1 by a roofer in the usual way. It is particularly advantageous that the respective photovoltaic roof tile 1 can first be placed on a roof batten 44 and can be mounted on this roof batten 44 from above by means of a batten retainer 40. In principle, the roof can be covered with the proposed photovoltaic roof tiles 1 as with standard, normal roof tiles. Of particular advantage here is that the roofer can access the cavity 10 of the photovoltaic roof tile 1 from above at any time. This is ensured in the manner described above by the provision of upper openings in the form of the outlet openings 11 on the upper face 8 of the photovoltaic roof tiles 1, and also facilitated by the covering or the glass package being designed to be movable upwards. This access to the cavity 10 ensures that the installer can easily secure the photovoltaic roof tile 1 on the roof by the fact that the photovoltaic roof tile 1 can be connected to the respective roof batten 44, e.g. by means of nailing or screwing, via the base plate 3 and the integrated base-plate-mounted storm suction protection elements 39.

Finally, adjacent photovoltaic roof tiles 1 can then be provided by placing the upper photovoltaic roof tile 1 in each case on the adjacent photovoltaic roof tile 1 below it and aligning it with this photovoltaic roof tile 1 arranged below it in such a way that the inlet opening 12 (lower opening) of the upper photovoltaic roof tile 1 is at least partially in alignment with the outlet opening 11 (upper opening) of the lower photovoltaic roof tile 1.

The metal plate tabs 37 of the adjacent photovoltaic roof tile 1 can be bent and adapted so that the respective vertical section 42 of the metal plate tab 37 rests against the inside of the rear face 7 of the photovoltaic roof tile 1 arranged below it and so that the horizontal section 43 of the metal plate tab 37 rests against the inside of the base plate 3 of the photovoltaic roof tile 1 arranged below it. Next, the base plate 3 or rear face 7 of the photovoltaic roof tile 1 arranged below can be connected to the metal plate tab 37 by penetrating the potential equalisation element 41 or screwing it in place by means of these two components. For this purpose, it is particularly advantageous that in the metal plate tab 37 different bores 38 are provided, arranged at regular intervals, through which bores 38 the potential equalisation element 41 can be inserted. In this way, it is also particularly advantageously possible to address the fact that roof battens 44 are not always evenly spaced on a roof and therefore the distances between individual photovoltaic roof tiles 1 can also always vary by small distances. The metal plate tab 37 cannot be bent from the initial state, as described, until the roof is being covered by the roofer, with the result that the horizontal sections 43 and the vertical sections 42 of the metal plate tabs 37 fit perfectly with the adjacent photovoltaic roof tile 1.

In order to support the arrangement and also the connection of adjacent photovoltaic roof tiles 1 to each other, the photovoltaic roof tiles 1 shown also each have a horizontal section 45 on the rear face 7. On this horizontal section 45, the next photovoltaic roof tile 1 arranged above can always be placed down with its base plate 3. In addition, this horizontal section 45 serves advantageously to partially cover or close the inlet opening 12 or lower opening of an adjacent photovoltaic roof tile 1 above, in case this inlet opening 12 (lower opening) of the photovoltaic roof tile 1 arranged above should extend further beyond the actual lateral wall of the rear face 7 of the photovoltaic roof tile 1 arranged below.

The potential equalisation element 41, which has already been described in part, is also used to ensure that the housings or base bodies of adjacent photovoltaic roof tiles 1 can be electrically conductively connected to each other. In this way, a potential equalisation can be created and electrical currents resulting, for example, from a potential difference between the upper face and lower face of the photovoltaic roof tiles 1, can be selectively discharged and, for example, fed into an earthing system. For this purpose, advantageously both the base plates 3 and the metal plate tabs 37 as well as the potential equalisation element 41 can be metallic or electrically conducting.

Due to the arrangement of upper openings in the form of the outlet openings 11 and of lower openings in the form of the inlet openings 12, unexpected advantages are achieved with regard to the installation and especially the individual disassembly of the proposed solar energy roof tiles, such as the photovoltaic roof tiles 1 shown. Thus, in the case of a covered roof with adjacent photovoltaic roof tiles 1 which are connected as described, for example, by means of potential equalisation elements 41 to their metal plate sheets 37 and the base plates 3 of the adjacent photovoltaic roof tiles 1 below them and are also attached to the roof battens 44 by means of batten retainers 40 and secured in the roof battens 44 by means of the base-plate-mounted storm suction protection elements 39, a single photovoltaic roof tile 1 can be dismantled quite simply. For this purpose, for example, the covering for the photovoltaic roof tile 1 to be dismantled, in the form of the upper face 8 or the glass package 9, can be shifted upwards. In this upward shifted position, the upper face 8 can also be secured and held in this position, for example, by means of securing mechanisms. Access can then be gained to the cavity 10 of this photovoltaic roof tile 1 to be dismantled and also to the cavity 10 of the photovoltaic roof tile 1 below, since its upper opening in the form of the outlet opening 11 is in turn arranged in alignment with the lower opening of the photovoltaic roof tile 1 to be dismantled in the form of the inlet opening 12. There, in the adjacent photovoltaic roof tile 1 below, the connection between the photovoltaic roof tile 1 to be dismantled and the photovoltaic roof tile 1 underneath can then be released by unscrewing the potential equalisation elements 41 connecting these two photovoltaic roof tiles 1. This process can then be repeated at the upper end near the rear face 7 of the photovoltaic roof tile 1 to be dismantled, this time however, by gaining access via the adjacent photovoltaic roof tile 1 above the photovoltaic roof tile 1 to be dismantled. This is because in the case of the adjacent photovoltaic roof tile 1, the upper face 8 can again be moved upwards and access can then be gained to the cavity 10 of the photovoltaic roof tile 1 to be dismantled. There, all necessary connections can then be released, specifically the screwed-in potential equalisation elements 41, but also the batten retainers 40 as well as the base-plate-mounted storm suction protection elements 39 of the photovoltaic roof tile 1 to be dismantled. Then the photovoltaic roof tile 1 to be dismantled is no longer secured and can simply be pulled down from the assembly formed with the adjacent photovoltaic roof tiles 1. A re-installation of a photovoltaic roof tile 1 into an assembly is also possible in reverse.

As an alternative or in addition to the movable upper face 8, the described advantages of an individual disassembly and installation of photovoltaic roof tiles 1 can also be achieved by means of a pivotable front face 4. By folding down the front face 4, in the same way as a previously described displacement of the upper face 8 upwards, access to an adjacent photovoltaic roof tile 1 can also be gained, again through the aligned openings in the form of the inlet opening 12 of the upper and the outlet opening 11 of the lower photovoltaic roof tile 1.

The advantages described due to the inlet openings 12 and the outlet openings 11 are transferable, in particular with regard to a simplified assembly and disassembly and maintenance measures, to solar energy roof tiles in general with an upper opening and a lower opening, as described. The present disclosure is not restricted to the described exemplary embodiment of a photovoltaic roof tile 1. In particular, the openings can also be provided solely for the simplification of the installation or laying of the solar energy roof tiles. The openings are also advantageous even if an air stream is not passed through the solar energy roof tiles. This can be the case for pure photovoltaic roof tiles as well as for solar thermal or combination roof tiles (using solar thermal and photovoltaic).

The invention claimed is:

1. A solar energy roof tile, which can be thermally and/or electrically conductively connected to an adjacent solar energy roof tile, the solar energy roof tile comprising:
    a lower face for placing on at least some regions of a roof structure,
    an upper face opposite the lower face, said upper face being formed at least in some regions by a solar energy utilisation module,
    two opposite lateral walls,
    a rear face connecting the two lateral walls, and
    a front face opposite the rear face that also connects the two lateral walls,
wherein the two lateral walls, the rear face and the front face together connect the lower face and the upper face, such that a cavity is formed between the two lateral walls, the rear face, the front face, the lower face and the upper face,
wherein the lower face has, in the region of the front face, a lower opening for providing access and the upper face has, in the region of the rear face, an upper opening for providing access into the cavity from the surroundings,
wherein the upper face has a covering configured to be movable in a longitudinal direction running from the front face to the rear face, wherein movability of the covering is maintained in an installed state.

2. The solar energy roof tile according to claim 1, wherein the solar energy roof tile is designed as a photovoltaic roof tile configured for obtaining electrical energy from solar radiation and that the solar energy utilisation module is designed as a photovoltaic module.

3. The solar energy roof tile according to claim 1, wherein the solar energy roof tile is designed as a solar thermal energy roof tile for obtaining thermal energy from solar radiation and that the solar energy utilisation module is designed as a solar thermal energy module.

4. The solar energy roof tile according to claim 1, wherein the solar energy roof tile is designed as a combined roof tile for obtaining electrical and thermal energy from solar radiation and that the solar energy utilisation module is designed as both a photovoltaic module and a solar thermal energy module.

5. The solar energy roof tile according to claim 1, wherein the lower opening is formed as an inlet opening for ambient air flowing into the cavity from the surroundings and the upper opening as an outlet opening for the ambient air from the cavity.

6. The solar energy roof tile according to claim 1, wherein the lower face is essentially formed by a metal base plate and the metal base plate has at least one metal plate tab, in the region of the lower opening.

7. The solar energy roof tile according to claim 6, wherein in an initial state of the solar energy roof tile, the metal plate tab extends essentially parallel to a ground plane of the metal base plate, and that, in the installed state when the solar energy roof tile is installed on a roof, the metal plate tab has a vertical section which runs essentially perpendicular to the ground plane and a horizontal section connected to the vertical section and runs essentially parallel to the ground plane.

8. The solar energy roof tile according to claim 6, wherein the metal plate tab has a plurality of bores spaced at regular intervals.

9. The solar energy roof tile according to claim 1, wherein the front face is designed to be pivotable, so that in an installed state the cavity is configured to be accessed from the outside.

10. A solar energy system comprising at least two interconnected solar energy roof tiles according to claim 1,
    wherein the upper opening of the solar energy roof tile arranged underneath in an installed state is at least partially aligned with the lower opening of the solar energy roof tile arranged on top in the installed state.

11. The solar energy system according to claim 10, wherein a consumer, in the form of a heat pump or heat exchanger, which uses the heat energy provided by the heated ambient air is directly connected to the upper opening of the solar energy roof tile that is arranged uppermost in the installed state.

12. The solar energy system according to claim 10, wherein a potential equalisation element is provided, which potential equalisation element extends at least partially at least through the two lower faces of the at least two interconnected solar energy roof tiles, the potential equalisation element being arranged such that the potential equalisation element connects a metal base plate of the solar energy roof tile arranged underneath in an installed state to a metal plate tab of the solar energy roof tile arranged above in the installed state.

13. A method for obtaining energy from solar radiation and simultaneously utilising a waste heat,
    wherein by a solar energy roof tile, according to claim 1, thermal and/or electrical energy is produced from solar radiation using a solar energy utilisation module and waste heat thereby generated due to heating of the solar energy utilisation module is discharged to ambient air flowing past and heated ambient air is delivered to a consumer, in the form of a heat pump or heat exchanger.

14. The method according to claim 13, wherein
    a plurality of solar energy roof tiles, are provided and mounted on a roof structure, that ambient air is drawn in by the solar energy roof tile located at the bottom in the installed state, that the ambient air drawn in is fed through the outlet opening and the inlet opening of respective adjacent solar energy roof tiles through the cavities of the adjacent solar energy roof tiles, and that the heated ambient air is drawn from the solar energy roof tile arranged uppermost in the installed state and fed to a consumer.

\* \* \* \* \*